(12) United States Patent
Noguchi et al.

(10) Patent No.: US 7,848,600 B2
(45) Date of Patent: Dec. 7, 2010

(54) DRIVING CIRCUIT OF OPTICAL GATE SWITCH

(75) Inventors: Masaji Noguchi, Kawasaki (JP); Tomohiro Ueno, Kawasaki (JP); Yutaka Kai, Kawasaki (JP); Setsuo Yoshida, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/727,632

(22) Filed: Mar. 27, 2007

(65) Prior Publication Data

US 2008/0068051 A1    Mar. 20, 2008

(30) Foreign Application Priority Data

Sep. 19, 2006    (JP)    ............................... 2006-253339

(51) Int. Cl.
*G02F 1/035* (2006.01)
(52) U.S. Cl. .............................. 385/16; 385/2; 327/110; 327/111
(58) Field of Classification Search ........................ None
See application file for complete search history.

(56) References Cited

U.S. PATENT DOCUMENTS

| | | | | |
|---|---|---|---|---|
| 4,093,877 | A | * | 6/1978 | Pollmeier .................... 327/109 |
| 6,633,696 | B1 | * | 10/2003 | Vahala et al. ................. 385/27 |
| 2003/0059154 | A1 | | 3/2003 | Sato |
| 2005/0189980 | A1 | * | 9/2005 | Washburn et al. ........... 327/333 |

FOREIGN PATENT DOCUMENTS

| | | |
|---|---|---|
| JP | 07-046194 | 2/1995 |
| JP | 2003-021795 | 1/2003 |
| JP | 2004-004317 | 1/2004 |
| JP | 2005-208178 | 8/2005 |

* cited by examiner

*Primary Examiner*—Uyen-Chau N Le
*Assistant Examiner*—Chad H Smith
(74) *Attorney, Agent, or Firm*—Staas & Halsey LLP

(57) ABSTRACT

A driving circuit of a semiconductor optical amplifier type gate switch constituting a matrix optical switch is provided with an operation amplifier into which a driving signal is input and from which a current corresponding to the driving signal is output, an inductance element provided at an output terminal of the operation amplifier, and a circuit composed of a diode element and a resistor element connected in parallel and provided between the inductance element and the semiconductor optical amplifier.

7 Claims, 19 Drawing Sheets

DRIVING CIRCUIT OF OPTICAL GATE SWITCH

BACKGROUND OF THE INVENTION

1. Field of the Invention

The present invention relates to a technology of an optical packet switching system used in an optical communication network.

2. Description of the Related Art

In optical communication networks, aiming for establishment of next-generation multimedia networks, an optical communication device of high speed and large capacity has been required. To realize a system providing high speed and large capacity, research and development of an optical packet switching system using a high-speed optical switch which can switch an optical path in a time on the order of nanoseconds (ns) has been advanced.

FIG. 1 is a diagram illustrating the optical packet switching system. An access node 14 such as a subscriber terminal or the like is connected to an edge node 11 via an access network. The edge node 11 is equipped with an optical packet assembly which coverts signal data from a subscriber into an optical packet. In addition, the edge node 11 is also connected to a core node 12. The core node 12 transmits an optical packet transmitted from the edge node 11 to a different core node 12 or an edge node 11 connected thereto.

Hereinafter, the core node 12 will be described with reference to FIG. 2. The core node 12 has a function of a matrix optical switch 21 for switching an optical path. The optical packet is transmitted by an optical data channel constituted by an optical fiber. The optical data channel is a channel utilizing a different wavelength than the optical fiber 13 physically connecting the edge node 11 and the core node 12. The wavelength of the optical packet is converted in the wavelength converting section 22. The optical packet whose wavelength has been converted is input into a matrix optical switch 21 and the pathway thereof is switched. The switch of the pathway in the matrix optical switch 21 is performed by a channel control section 24 and a reservation manager 23 controlling the matrix optical switch 21 by an instruction supplied by the channel control section 24 of a control section 25. Pathway information of the optical packet is input into the channel control section 24 of the control section 25 from a control channel. The channel control section 24 analyzes a label signal transferred via the control channel. The control channel may be a channel utilizing a different wavelength than that of the optical data channel in the optical fiber 13 physically connecting the core nodes 12 and may be an optical fiber or a coaxial wire which are different from the optical fiber 13. The reservation manager 23 analyzes the pathway information of the label signal transmitted via the control channel to control the matrix optical switch 21. The matrix optical switch 21 switches the pathway toward an output port instructed by the reservation manager 23.

FIG. 3 shows a switch timing at which the pathway is switched for transmittance of an optical packet 34. As shown in FIG. 3, the switch timing at which the pathway is switched for transmittance of the optical packet 34 is applied after a predetermined offset time 31 from application of a label signal 33 containing pathway information of the channel control section 24. The matrix optical switch is required to be switched for a short time, for example, the switch time 32 thereof is about 45 ns. This is a guard time imposed so as not to influence transmission of the optical packet 34. That is, an optical port must be switched within a short guard time in the optical packet switching system. Various investigations have been made into the matrix optical switch so as to enable the core node to be constituted. However, a structure with which switch of the optical port at a speed which satisfies the condition described above is performed has not been investigated. An example of a matrix optical switch for constituting a core node has been described in Japanese Laid-Open Patent No. 2003-21795.

SUMMARY OF THE INVENTION

An object of the present invention is to provide a technique for stably switching a matrix optical switch at high speed so as to make it possible to switch an optical port within a short guard time.

In order to attain the object described above, the above described problem is solved by means described below in the invention.

A driving circuit for driving an optical gate switch comprises a current providing circuit, an inductance element and a parallel circuit.

The current provides circuit for outputting current in accordance with a driving signal for driving the optical gate switch, the current outputted from an output terminal of the current providing circuit to the optical gate switch.

The inductance element is electrically arranged between the output terminal and the optical gate switch.

The parallel circuit is comprised a diode element and a resistor element connected in parallel and electrically arranged between the output terminal and the optical gate switch.

DESCRIPTION OF THE PREFERRED EMBODIMENTS

Hereinafter, embodiments of the present invention will be described with reference to the accompanying drawings. It should be noted here that the constructions of the embodiments are an exemplification, and the present invention is not limited to constructions of the embodiments.

First Embodiment

Figure 1:
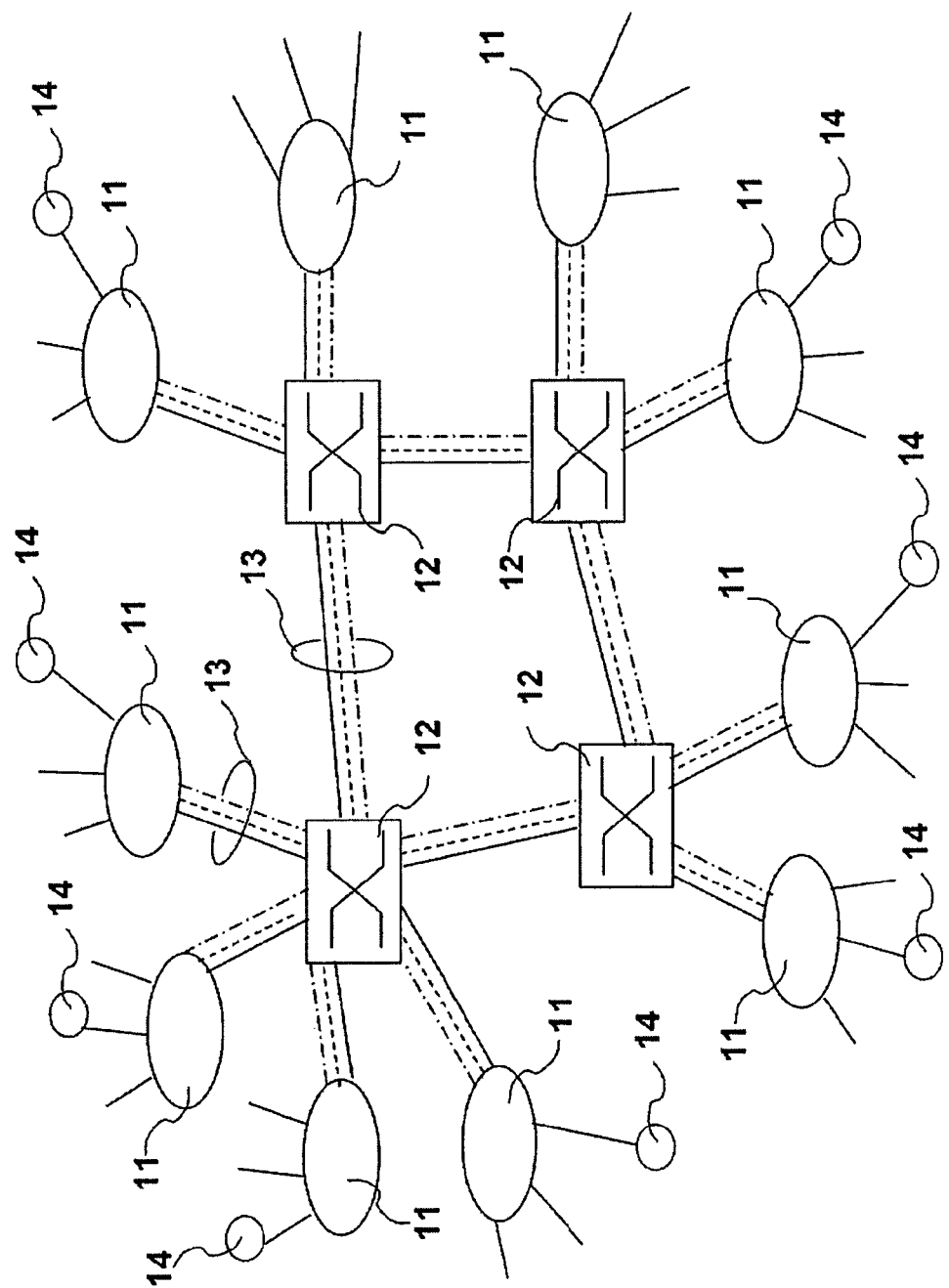
FIG. 1 is a diagram for illustrating an optical packet switching network.
Figure 2:
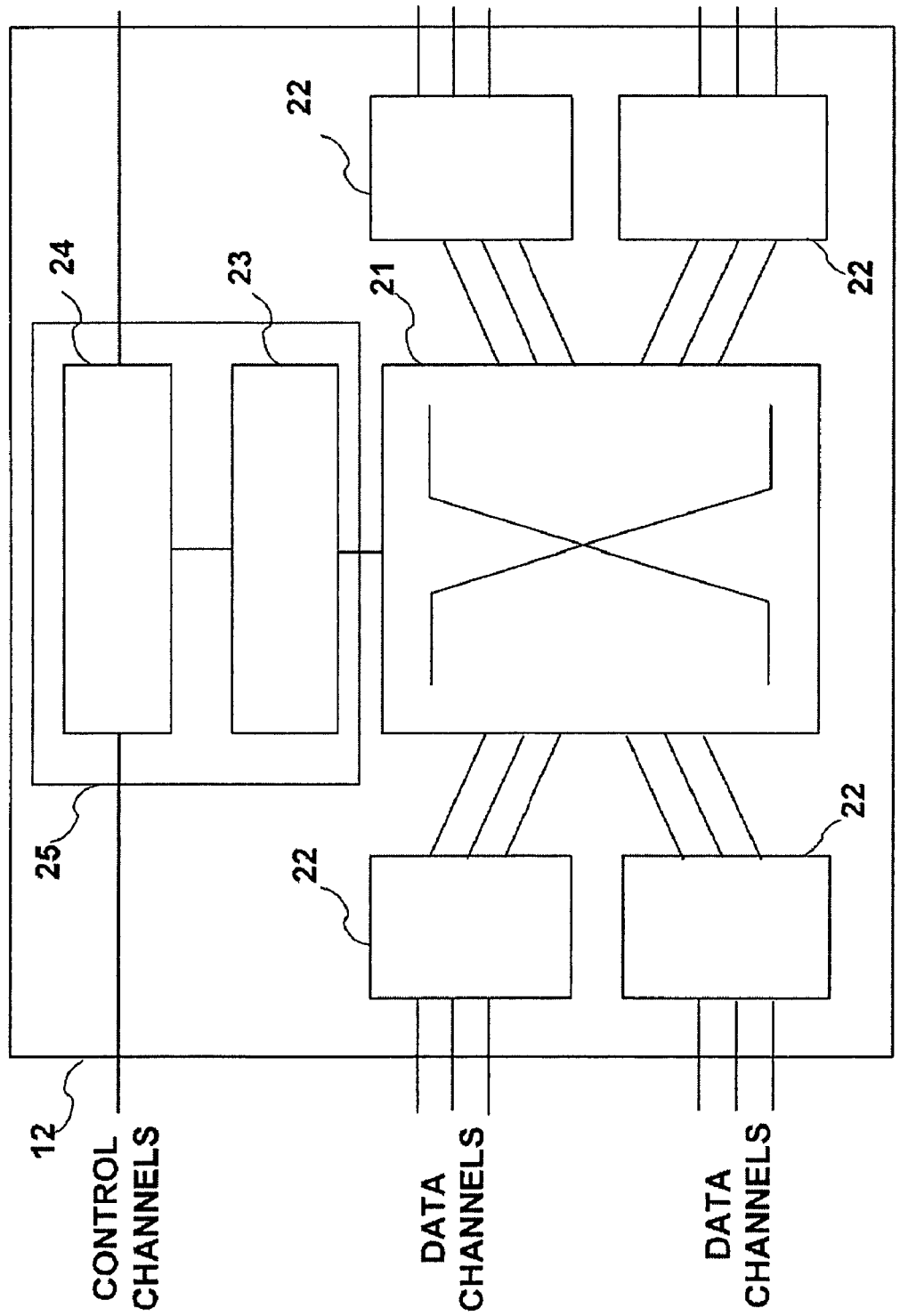
FIG. 2 is a diagram illustrating a core node.
Figure 3:
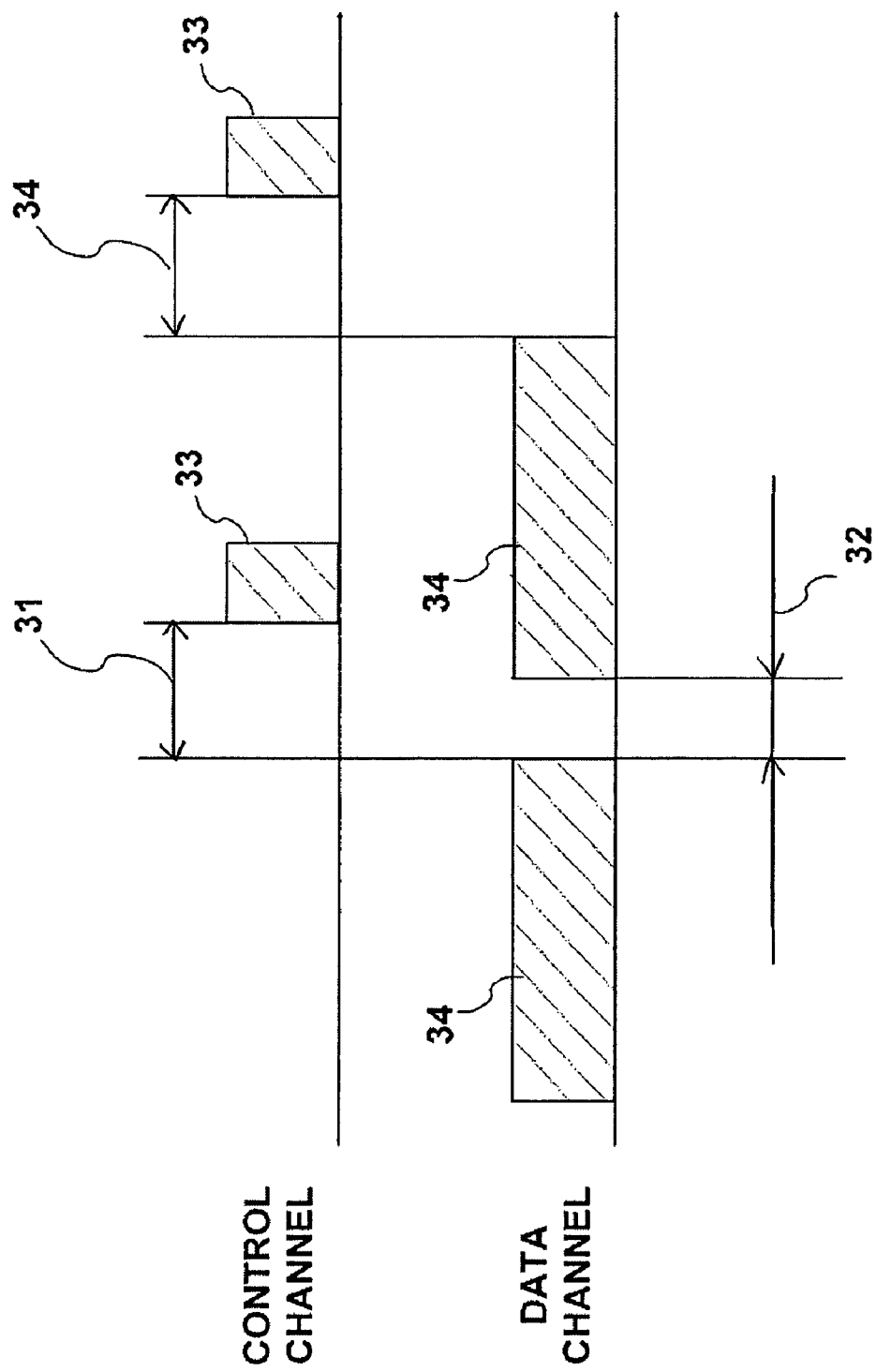
FIG. 3 is a diagram showing a switch timing of a root to an optical packet.

The embodiment relates to a matrix optical switch to be applied to a core node 12 shown in FIG. 2.

Figure 4:
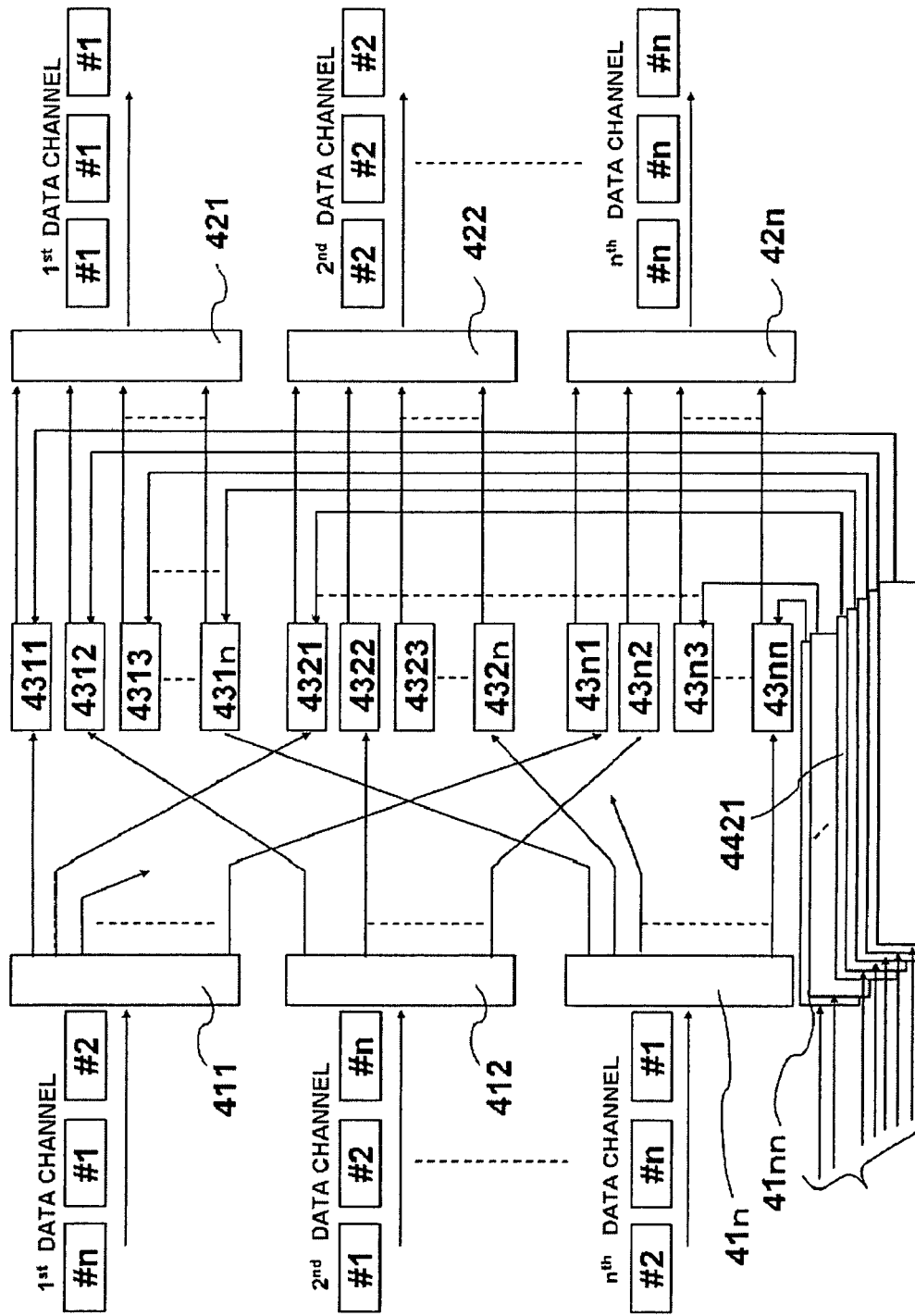
FIG. 4 is a diagram showing an exemplary configuration of a matrix optical switch.

Matrix Optical Switch:

An exemplary configuration of a matrix optical switch (corresponding to a matrix optical switch 21 in FIG. 2) of the present invention is shown in FIG. 4. Hereinafter, configurations of each block in FIG. 4 will be described in detail.

Optical Distribution Coupler:

Reference numerals 411, 412 to 41$n$ each denote an optical distribution coupler of one input and n outputs. Each of the optical distribution couplers 411, 412 to 41$n$ has one input port and n output ports. The optical distribution coupler 411 receives an optical packet from a first data channel. Similarly, the optical distribution couplers 412 to 41$n$ respectively receive a corresponding one of optical packets sent from a second data channel to an $n^{th}$ data channel. In the example in FIG. 4, optical packets #2, #1, and #n are input into an input port of the optical coupler 411 in this order from the first data channel. Optical packets #n, #2, and #1 are input into an input port of the optical coupler 412 in this order from the second data channel. Optical packets #1, #n and #2 are input into an input port of the optical coupler 41$n$ in this order from the $n^{th}$ data channel. The optical distribution couplers 411 to 41$n$ constitute a matrix optical switch, so that the number of output ports that each of the optical distribution couplers 411 to 41$n$ has for performing branching is the same as the number of optical multiplex couplers to be described below.

Semiconductor Optical Amplifiers:

Reference numerals 4311 to 431$n$, 4321 to 432$n$, and 43$n$1 to 43$nn$ each denote a semiconductor optical amplifier. The number of semiconductor optical amplifiers 4311 to 43$nn$ is same as the number of output ports of the couplers branched in the optical distribution couplers 411 to 41$n$. Then, each of the semiconductor optical amplifiers 4311 to 43$nn$ switches light from a corresponding one of the output ports of the couplers according to whether or not there is a driving current supplied from a driving circuit to be described below. Each of outputs of the semiconductor optical amplifiers 4311 to 43$nn$ is input to a corresponding one of input ports of optical multiplex couplers to be described below.

Optical Multiplex Couplers:

Reference numerals 421, 422 to 42$n$ each denote an optical multiplex coupler of n inputs and one output. The number of input ports of each of the optical multiplex couplers 421, 422 to 42$n$ is the same as the number of optical distribution couplers. The light input into each of the input ports thereof is output to one output port. The optical multiplex coupler 421 outputs an optical packet to a first data channel. The optical multiplex coupler 422 outputs an optical packet to a second data channel. The optical multiplex coupler 42$n$ outputs an optical packet to an $n^{th}$ data channel. Each of the optical packets #1 input into one of the optical distribution couplers 411, 412, to 41$n$ is output from the first data channel which is the output port of the optical multiplex coupler 421. Each of the optical packets #2 input into one of the optical distribution couplers 411, 412, to 41$n$ is output from the second data channel which is the output port of the optical multiplex coupler 422. Each of the optical packets #n input into one of the optical distribution couplers 411, 412, to 41$n$ is output from the #n data channel which is the output port of the optical multiplex coupler 42$n$.

Driving Circuit:

Reference numerals 4411 to 44$nn$ each denote a driving circuit. The driving circuits 4411 to 44$nn$ are each a circuit for supplying an electric current to a corresponding one of the semiconductor optical amplifiers 4311 to 43$nn$ on the basis of a driving signal. The electric current has an electric current value with which the semiconductor optical amplifiers 4311 to 43$nn$ have a gain and amplify input light and an electric current value with which the semiconductor optical amplifiers 4311 to 43$nn$ absorb an input light. Each of the driving circuits 4411 to 44$nn$ supplies a voltage and a current at the same time.

Figure 5:
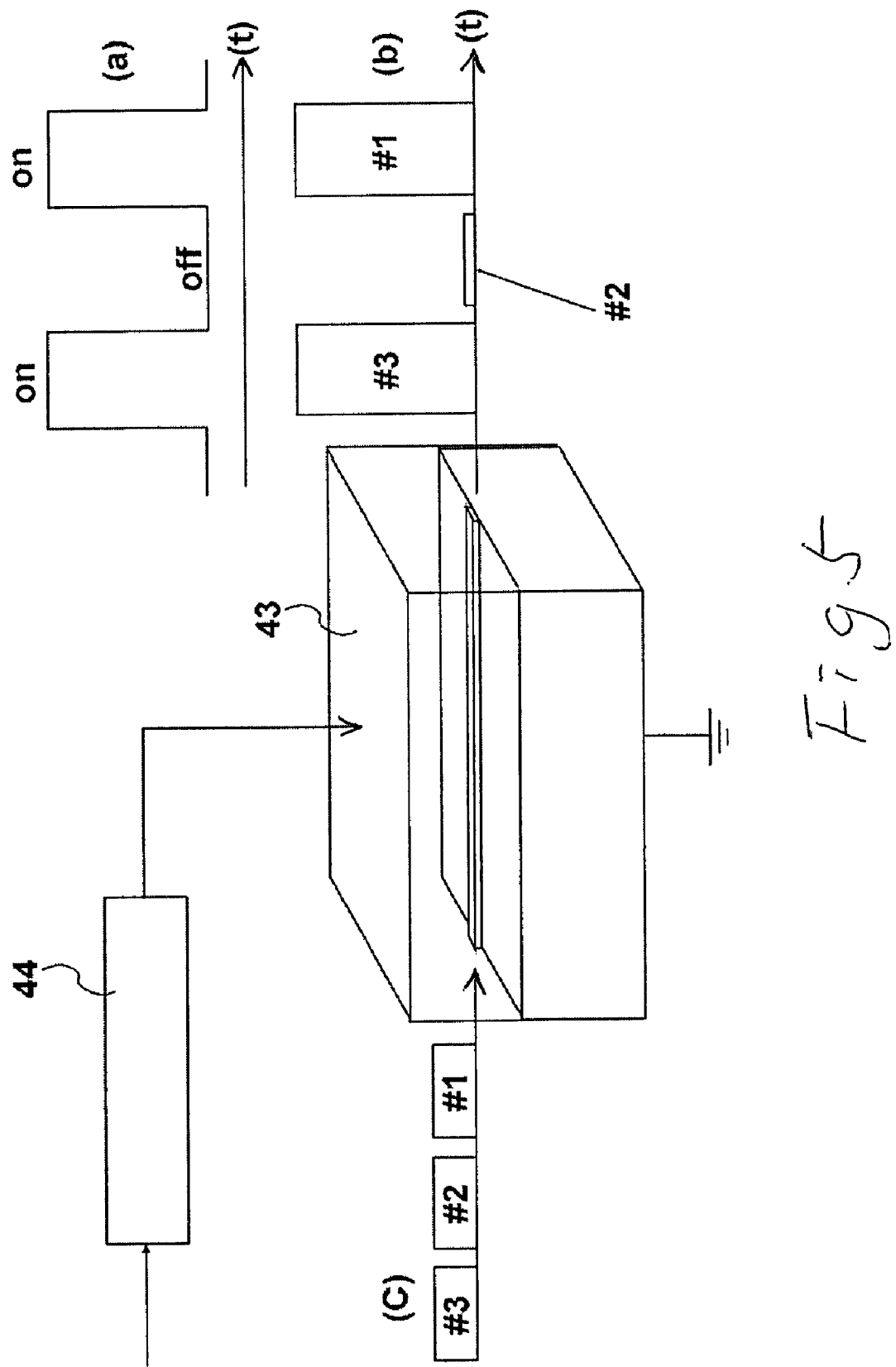
FIG. 5 is a diagram showing a relationship between inputs and outputs of a driving circuit and a semiconductor optical amplifier.

An exemplary configuration of the driving circuit will be described below with reference to FIG. 5. FIG. 5 shows a relationship between inputs and outputs of the driving circuit and the semiconductor optical amplifier. The driving circuit 44 is the same as the driving circuits 4411 to 44$nn$ in FIG. 4. The semiconductor optical amplifier 43 is the same as the semiconductor optical amplifiers 4311 to 43$nn$ in FIG. 4. The driving circuit 44 supplies a current shown by (a) in FIG. 5 to the semiconductor optical amplifier 43. The semiconductor optical amplifier 43 receives light (optical packet) of (c) in an optical amplifier region. The optical amplifier region outputs a light of (b). The output light of (b) varies in accordance with the change of a current value of (a). In the example in FIG. 5, the optical packets #1 and #3 are output from the optical amplifier region but optical packet #2 is not output. The semiconductor optical amplifier 43 has a function of an optical gate element. Accordingly, the semiconductor optical amplifier 43 may be termed a semiconductor optical amplifier type gate switch.

Operation of Matrix Optical Switch:

The entire operation of the matrix optical switch will be described with reference to FIG. 4. The optical packet #2 of the first data channel is input to the optical distribution coupler 411. The optical distribution coupler 411 branches the optical packet #2 into n optical packets. The branched optical packets are respectively input into the semiconductor optical amplifiers 4311 and 4321 and 43$n$1 (also input into 432$n$ to 43$n$1 but omitted here for brevity). When the optical packet #2 is output from the optical distribution coupler 411, a driving current flows from the driving circuit 4421 and the semiconductor optical amplifier 4321 amplifies and outputs the optical packet #2. A driving signal is not supplied for the optical packets #1 and #n which follow the optical packet #2 and are input into the optical distribution coupler 411, so that the optical packets #1 and #n are captured in the semiconductor optical amplifiers 4321 and not output. The output of the semiconductor optical amplifier 4321 is input into the optical multiplex coupler 422. The optical packet #2 is output from the output port of the optical multiplex coupler 422 as a second data channel. The optical packet #1 input into the optical distribution coupler 411 following the optical packet

2 is branched in the optical distribution coupler 411 and after that, is gated on the basis of a current supplied from the driving circuit in the semiconductor optical amplifier 4311 to be output into the optical multiplex coupler 421. In this manner, an optical packet flowing in one of the data channels of the input side can be switched to any data channel by being branched by the optical distribution coupler, gated by the semiconductor optical amplifier, and multiplexing the gated output of the optical multiplex coupler.

Figure 6:
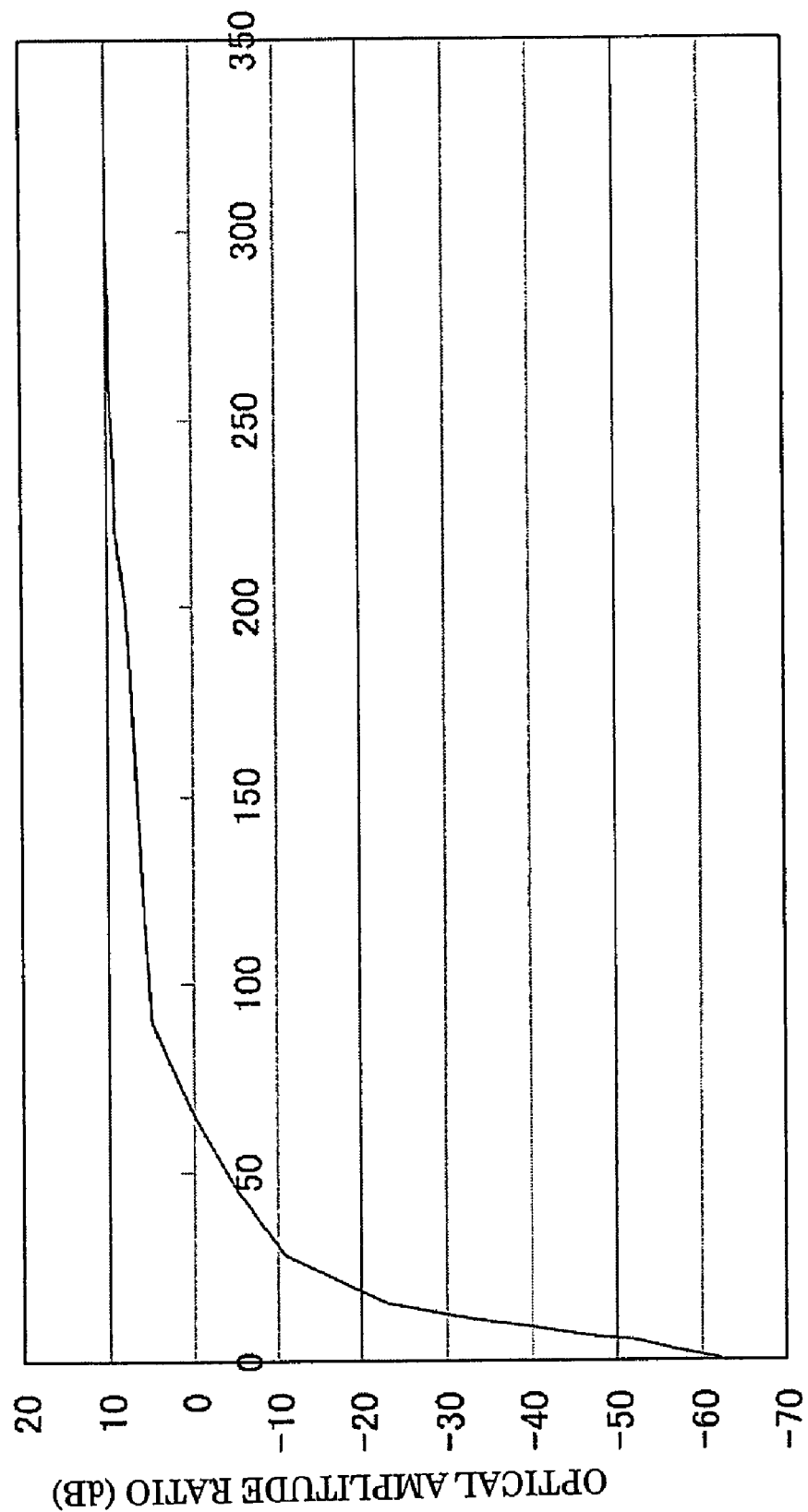
FIG. 6 is a diagram showing a driving current versus an optical gain for a semiconductor optical amplifier type gate switch.

Properties of Semiconductor Optical Amplifier Type Gate Switch:

FIG. 6 shows driving current versus optical gain for the semiconductor optical amplifier (semiconductor optical amplifier type gate switch) in FIG. 5. The semiconductor optical amplifier (semiconductor optical amplifier type gate switch) has a property in which the optical gain is changed in accordance with a driving current. An optical gain of about 10 dB can be obtained by supplying a driving current of about 300 mA as shown in FIG. 6. The gain of about 10 dB corresponds to the approximately saturated state. On the other hand, when the driving current is reduced to below 65 mA, the semiconductor optical amplifier (semiconductor optical amplifier type gate switch) operates as a light fader, so that the light input to the semiconductor optical amplifier (semiconductor optical amplifier type gate switch) is attenuated.

Figure 7:
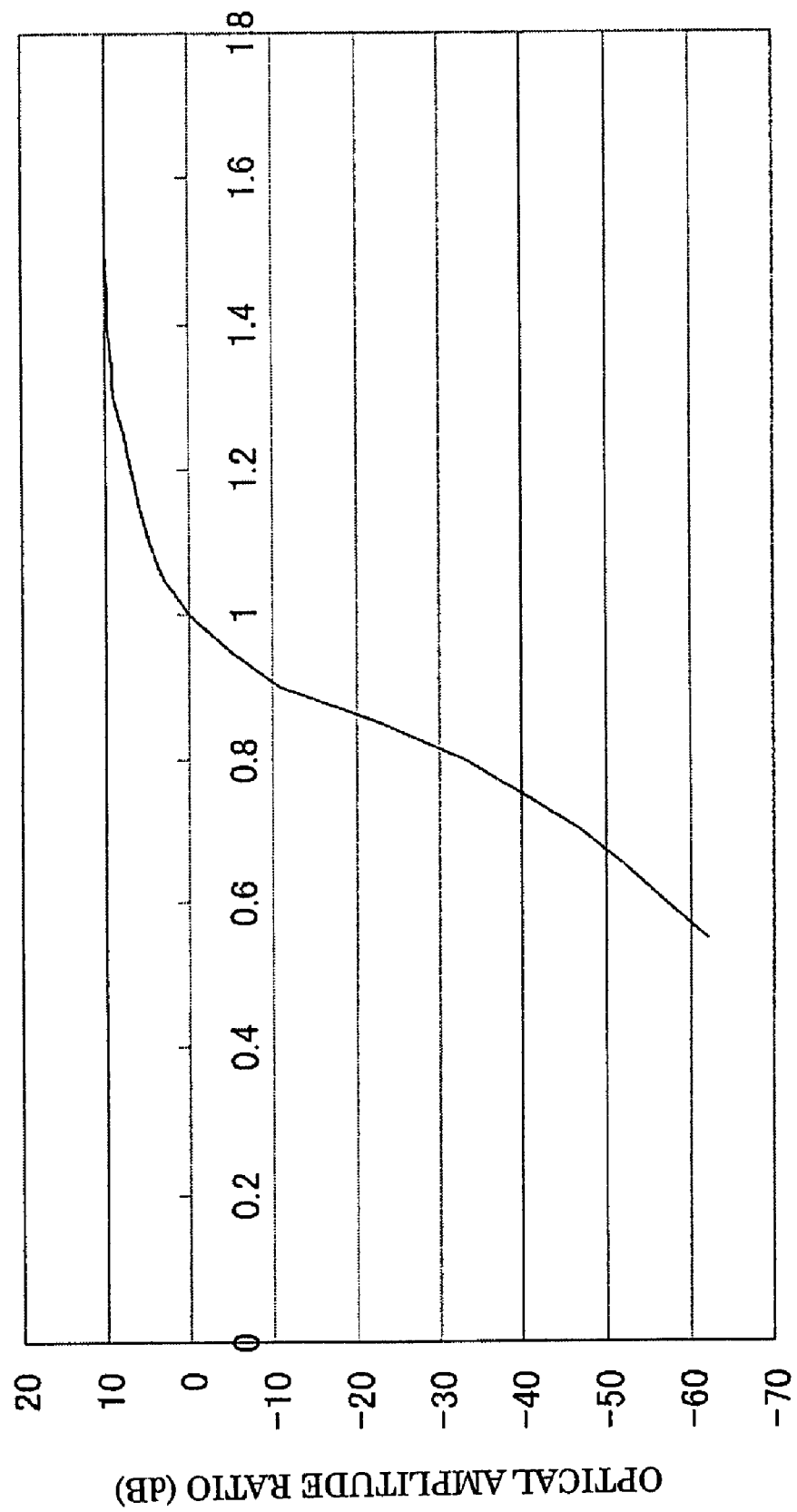
FIG. 7 is a diagram showing a driving voltage versus the optical gain for the semiconductor optical amplifier type gate switch.

FIG. 7 shows driving voltage versus optical gain for the semiconductor optical amplifier type gate switch in FIG. 5. The semiconductor optical amplifier (semiconductor optical amplifier type gate switch) is of a current driving type. However, voltage driving can be performed by applying voltage from a voltage source which enables a current of not less than 300 mA to flow. In FIG. 7, when a source voltage of 1.5 V is applied, the optical gain is about 10 dB. When the optical gain is about 10 dB, the current of about 300 mA should flow according to the graph of driving current in FIG. 6. If the driving voltage is reduced, the same light attenuation property is shown as the graph in FIG. 6. When the voltage is reduced to below 1 V, the semiconductor optical amplifier (semiconductor optical amplifier type gate switch) operates as a light fader.

Figure 8:
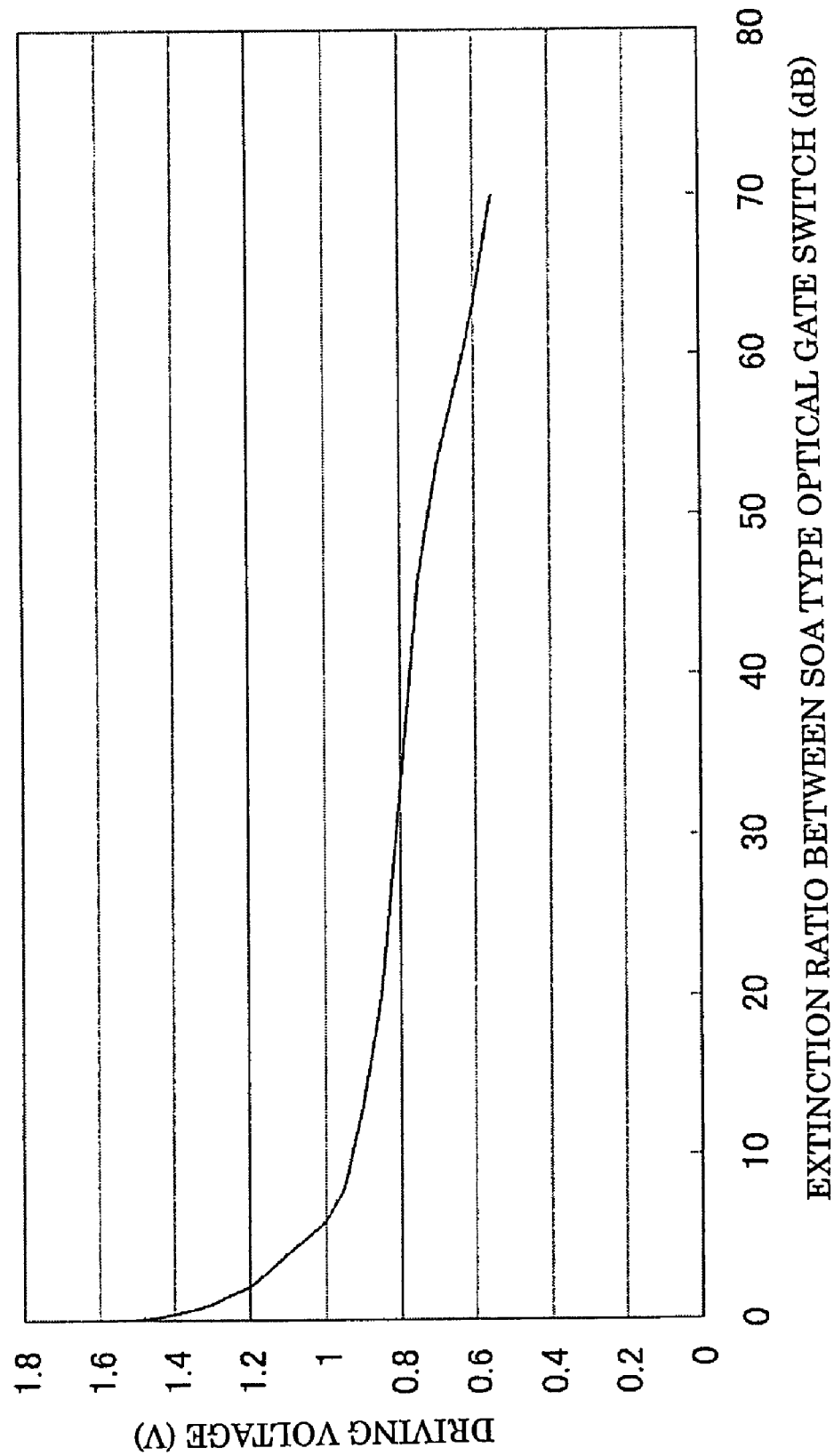
FIG. 8 is a diagram showing the driving voltage of the semiconductor optical amplifier type gate switch versus an extinction ratio between optical switches of the semiconductor optical amplifier type gate switches.

FIG. 8 shows the driving voltage of the semiconductor optical amplifier type gate switch in FIG. 5 versus the extinction ratio between optical switches of the semiconductor optical amplifier type gate switches. In the matrix type optical switch structure shown in FIG. 4, the same number of semiconductor optical amplifier type gate switches as the number of output ports are connected in the output section of the multiplex coupler section. When one semiconductor optical amplifier type gate switch is turned to ON, all of the remaining semiconductor optical amplifier type gate switches are turned to OFF states. However, even when the semiconductor optical amplifier type gate switches are in OFF states, optical leakage #2 occurs as shown by (b) in FIG. 5. The optical leakage causes optical cross-talk in the multiplex couplers. FIG. 8 is a graph showing the optical cross talk as an extinction ratio property. For example, when a matrix optical switch of 8×8 elements is to be constructed, as an extinction ratio property of about 58 dB is required between ON and OFF states. In order to gain such an extinction ratio property, the driving voltage needs to be set to not more than 0.65 V.

Driving circuit of Semiconductor Optical Amplifier Type Gate Switch: No. 1

Figure 9:
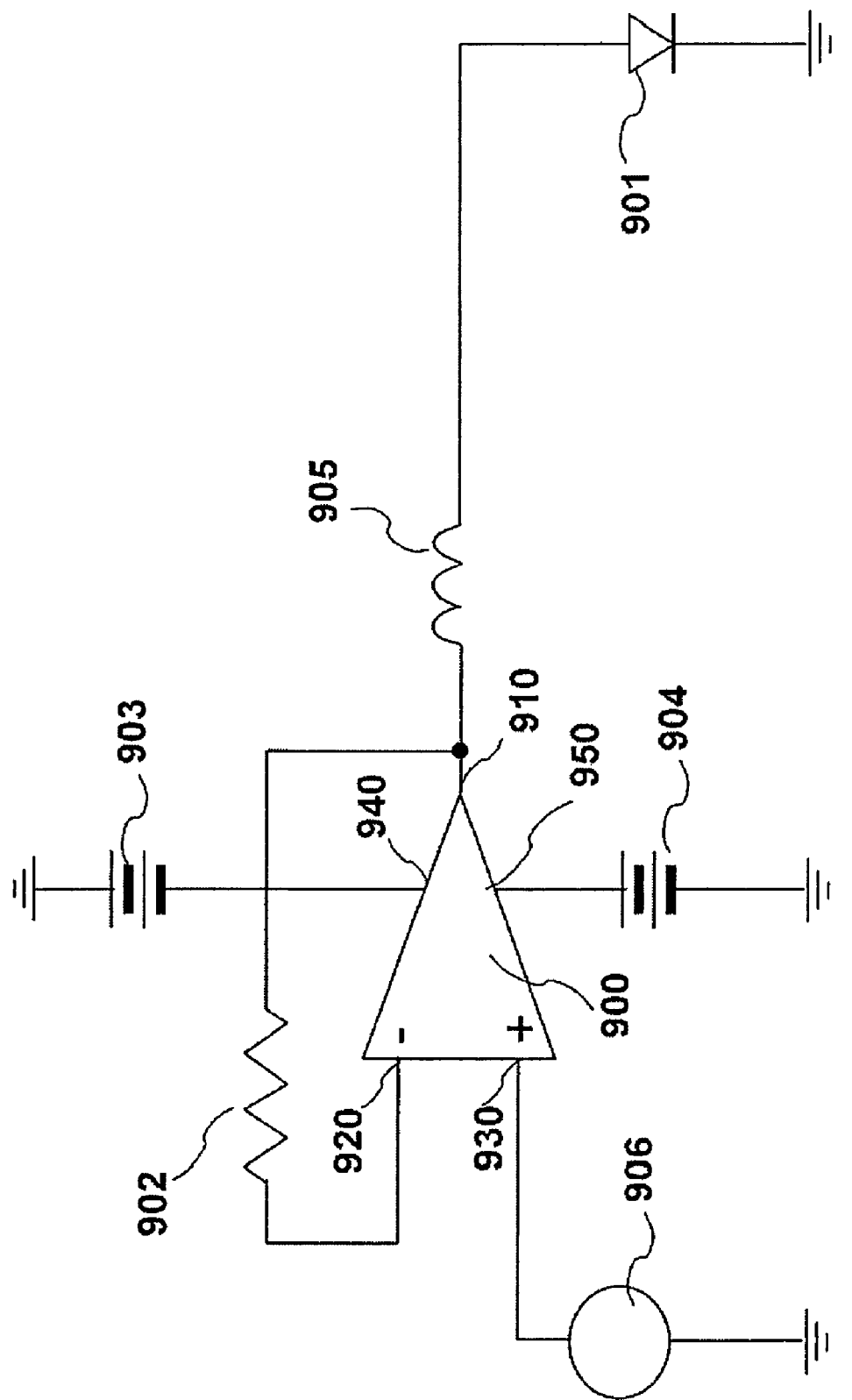
FIG. 9 is a diagram showing a driving circuit of the semiconductor optical amplifier type gate switch.
Figure 10:
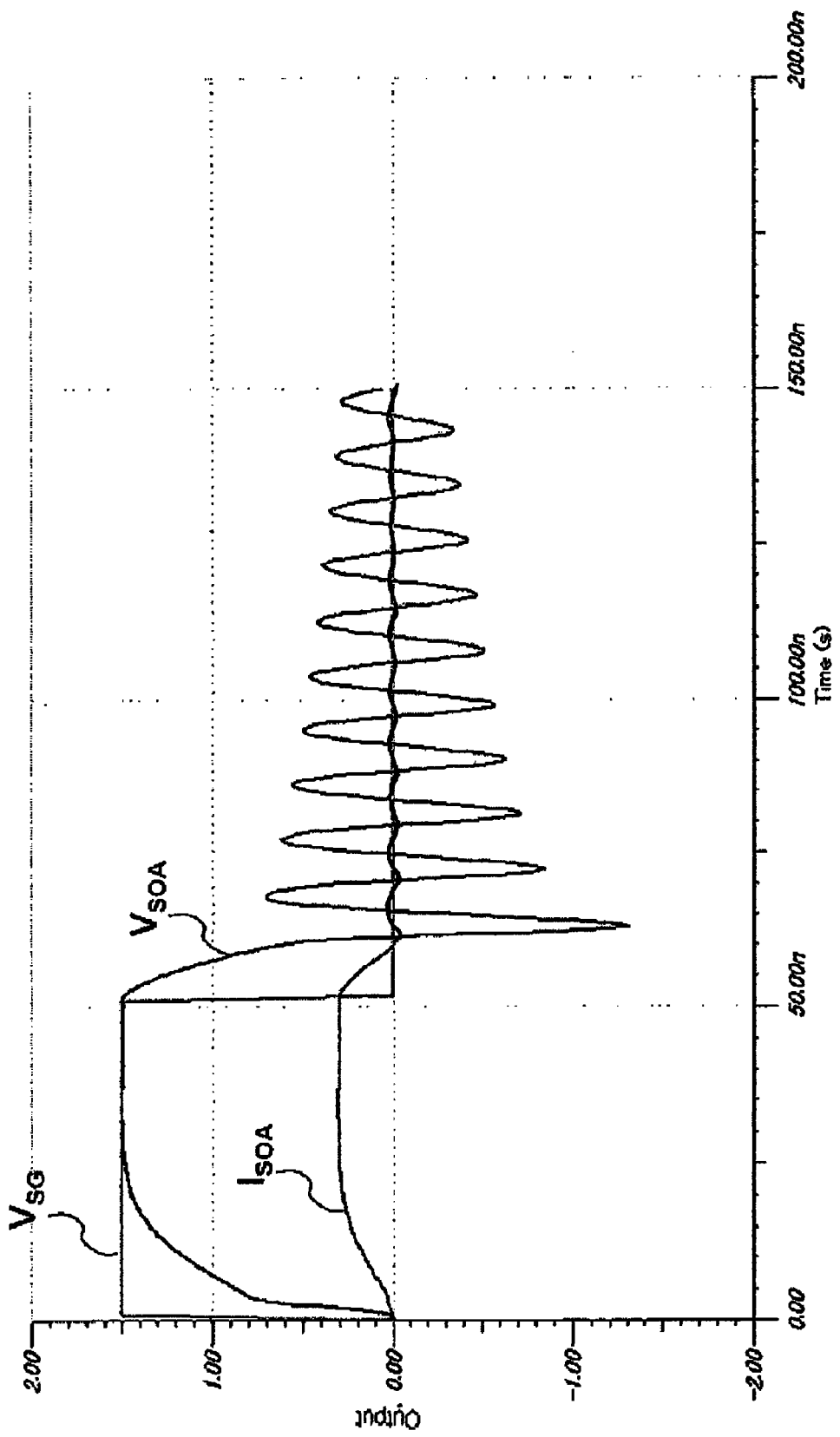
FIG. 10 is a waveform diagram of the semiconductor optical amplifier type gate switch in FIG. 9.

FIG. 9 shows a circuit diagram of the driving circuit of the semiconductor optical amplifier type gate switch in FIG. 5. The circuit diagram in FIG. 9 is a driving circuit constructed in accordance with the properties shown in FIGS. 6 to 8. In addition, a waveform diagram when the semiconductor optical amplifier type gate switch is driven is shown in FIG. 10.

Structure of Driving Circuit:

In FIG. 9, reference numeral 900 denotes a high-speed operation amplifier. Reference numeral 901 denotes a semiconductor optical amplifier type gate switch (semiconductor optical amplifier). Reference numeral 906 denotes a signal source. Reference numeral 902 denotes a feedback resistor. Reference numeral 905 denotes an inductor (inductance element). Reference numeral 903 denotes a negative power source. Reference numeral 904 denotes a positive power source. The high-speed operation amplifier 900 is composed of an integrated circuit (IC).

The high-speed operation amplifier 900 constitutes a non-inverting amplifier. The high-speed operation amplifier 900 has an output current capacity not less than 300 mA and has a stable time (set ring time) of about 20 ns. The feedback resistor 902 is provided between an output terminal 910 of the high-speed operation amplifier 900 and an inverting input terminal 920. As an example, the resistance value of the feedback resistor 902 is 910Ω. The signal source 906 is provided between a non-inverting input terminal 930 of the high-speed operation amplifier 900 and ground. The inductor 905 is provided between the output terminal 910 of the high-speed operation amplifier 900 and the semiconductor optical amplifier type gate switch 901. The inductor 905 provided at an output portion of the high-speed operation amplifier 900 is provided so as to prevent an overshooting of a current at an output rise-up time (ON time) of the high-speed operation amplifier 900. As an example, the inductance of the inductor 905 is 13 nH. The negative power source 903 is provided between a negative power source terminal 940 of the high-speed operation amplifier 900 and ground. As an example, the voltage of the negative power source 903 is −5 V. The positive power source 904 is provided between a positive power source terminal 950 of the high-speed operation amplifier 900 and ground. As an example, the voltage of the positive power source 904 is +5 V.

Operation of Driving Circuit:

A voltage of a rectangular wave signal which controls ON/OFF of the semiconductor optical amplifier type gate switch is applied to the non-inverting input terminal of the high-speed operation amplifier 900 from the signal source 906. In FIG. 9, the signal source indicates a signal from the control section 25 in FIG. 2. A rectangle voltage waveform which is set to 1.5 V during ON time and 0 V during OFF time is exemplified as a waveform of the signal source 906. The non-inverting output of the high-speed operation amplifier 900 is also to be set at the same voltage as the input voltage. According to the graphs in FIGS. 6 and 7, when the output of the high-speed operation amplifier 900 is set to 1.5 V, a driving current of about 300 mA flows in the semiconductor optical amplifier type gate switch 901 and the semiconductor optical amplifier type gate switch 901 becomes ON state in accordance with the property in FIG. 6. When the output of the high-speed operation amplifier 900 is set to 0 V, no driving current flows in the semiconductor optical amplifier type gate switch 901 and the semiconductor optical amplifier type gate switch 901 becomes OFF state. With this construction, the semiconductor optical amplifier type gate switch 901 can be operated.

FIG. 10 shows a waveform diagram of the semiconductor optical amplifier type gate switch of the driving circuit in FIG. 9. $V_{SG}$ shows an output voltage of the high-speed operation amplifier 900. $V_{SOA}$ shows a voltage applied to the semiconductor optical amplifier type gate switch 901. $I_{SOA}$ shows a current flowing the semiconductor optical amplifier type gate switch 901. The unit of the electrostatic voltage waveform is volt (V) and the unit of the current waveform is ampere (A) in FIG. 10. When the voltage set to the output of the high-speed operation amplifier 900 falls down (OFF time), the electric charge charged during ON time is discharged by the junction capacitance (about 40 pF) of the semiconductor optical amplifier type gate switch 901 itself. This discharge, the inductance of the inductor 905, and the capacitance of the semiconductor optical amplifier type gate switch 901 generates ringing. According to the property in FIG. 8, an extinction ratio which is needed for an 8×8 matrix optical switch is 58 dB, and in order to provide the extinction ratio property, the driving voltage needs to be not more than 0.65 V. However, because of the influence of the ringing, the time within which the driving voltage becomes not more than 0.65 V requires more than 45 ns in the driving circuit.

Driving Circuit of Semiconductor Optical Amplifier Type Gate Switch: No. 2

Figure 11:
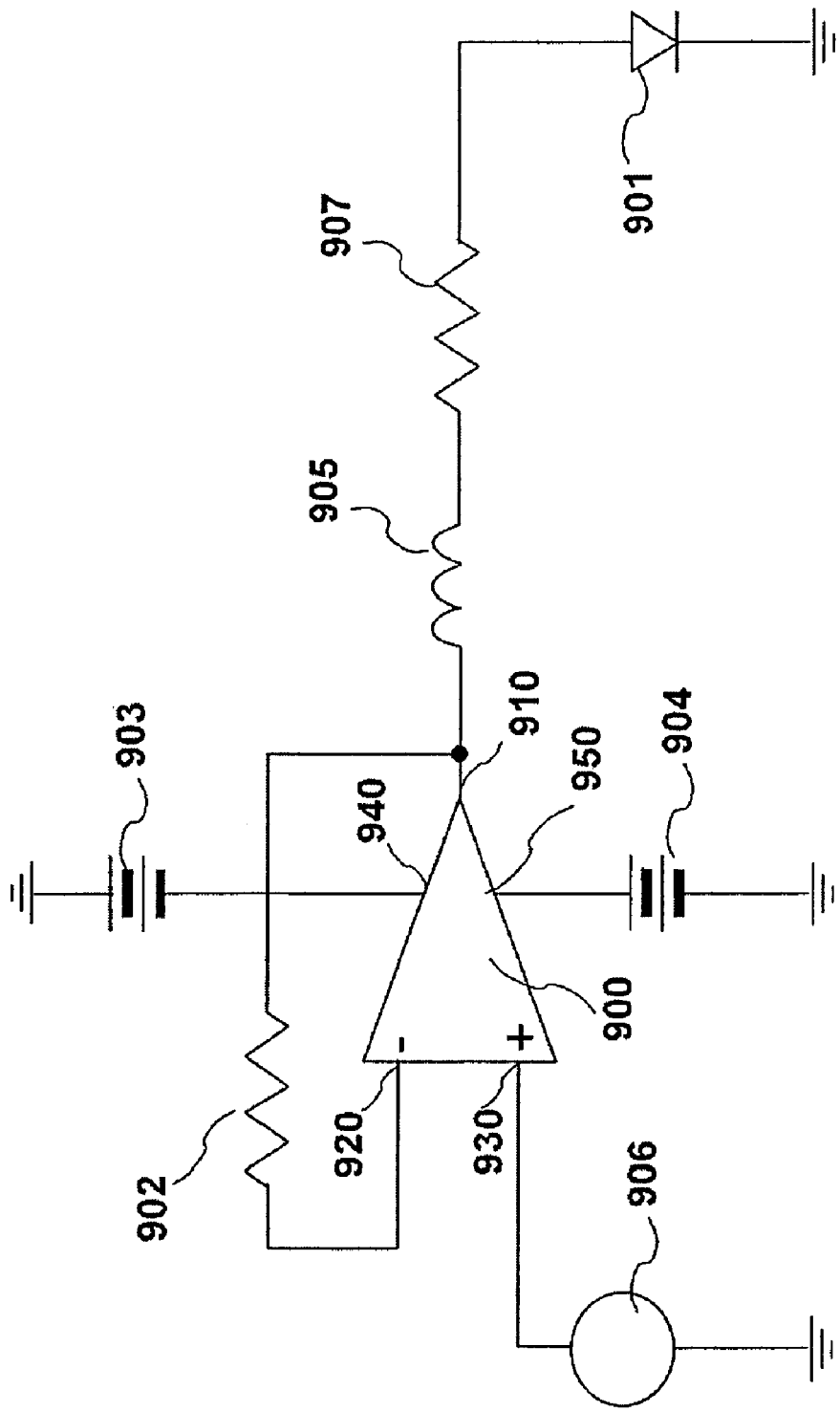
FIG. 11 is a diagram showing a driving circuit of the semiconductor optical amplifier type gate switch.

FIG. 11 shows a circuit diagram of a driving circuit of the semiconductor optical amplifier type gate switch. Like reference numerals are used for like members, and their descriptions will be omitted. The driving circuit in FIG. 11 is a modification of the driving circuit in FIG. 9. To be more specific, a resistor 907 is provided between the inductor 905 and the semiconductor optical amplifier type gate switch 901 so as to prevent the ringing generated in the driving circuit in FIG. 9. As examples, the resistance value of the resistor 907 is 30Ω, the voltage of the negative power source 940 of the high-speed operation amplifier 900 is −15 V, and the voltage of the positive power source 950 of the high-speed operation amplifier 900 is +15 V.

Figure 12:
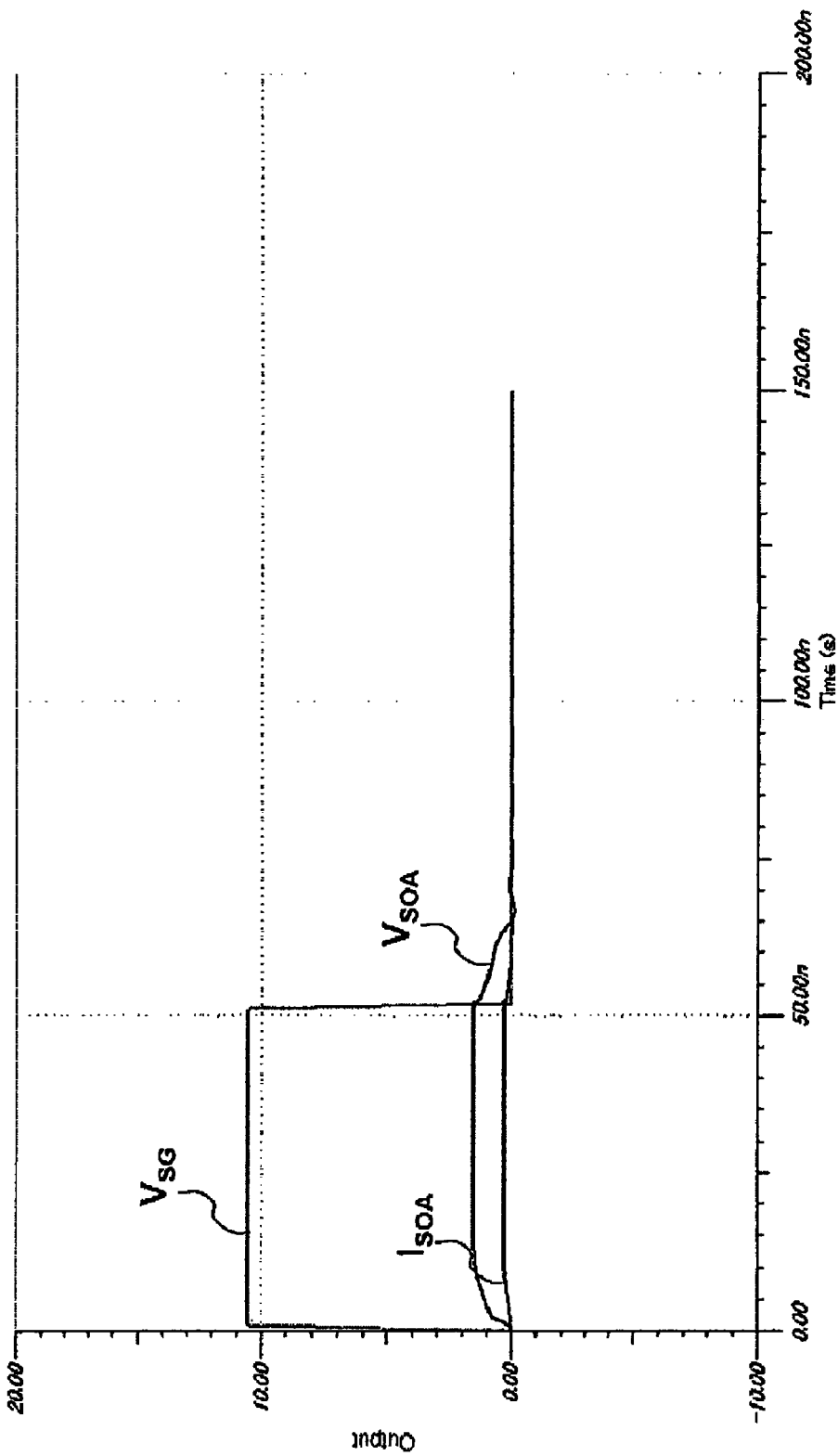
FIG. 12 is a waveform diagram of the semiconductor optical amplifier type gate switch in FIG. 11.

FIG. 12 shows a waveform diagram of the semiconductor optical amplifier type gate switch of the driving circuit in FIG. 11. $V_{SG}$, $V_{SOA}$, and $I_{SOA}$ show the values of the same places in FIG. 10. Insertion of the resistor 907 of 30Ω requires a large voltage about 11.5 V as for an output voltage of the high-speed operation amplifier 900. Further, the electric power consumption of the driving circuit is increased by the insertion. Moreover, the electric power consumption of the resistor 907 rises up to 2.7 W when the current is 300 mA.

Driving Circuit of Semiconductor Optical Amplifier Type Gate Switch: No. 3

Figure 13:
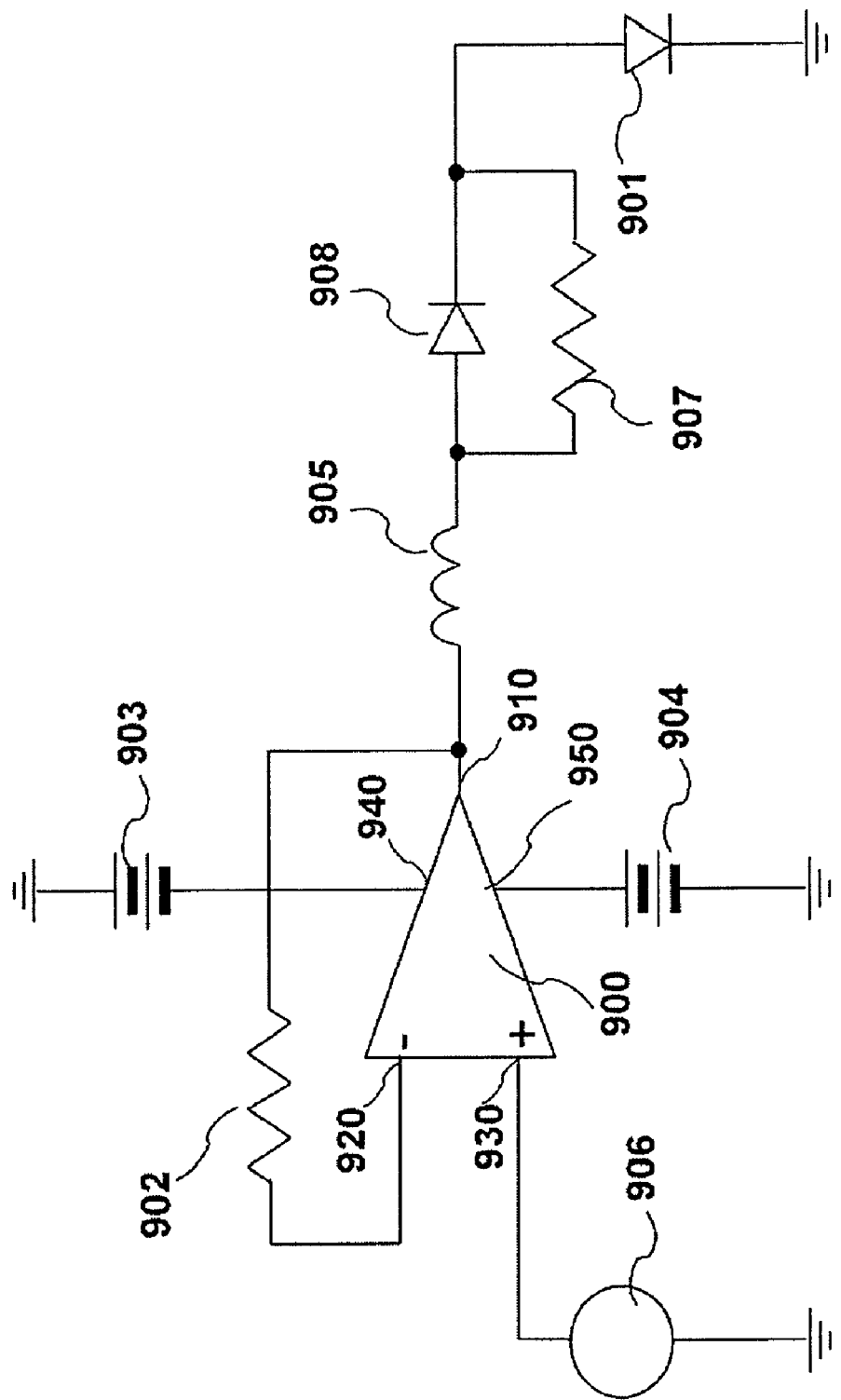
FIG. 13 is a diagram showing a driving circuit of the semiconductor optical amplifier type gate switch.

FIG. 13 shows a circuit diagram of a driving circuit of the semiconductor optical amplifier type gate switch. The driving circuit in FIG. 13 is a modification of the driving circuit in FIGS. 9 and 11. In the circuit structure, ringing is prevented and electric power consumption is reduced.

Structure of Driving Circuit:

Reference numeral 900 denotes a high-speed operation amplifier IC. Reference numeral 901 denotes a semiconductor optical amplifier type gate switch (semiconductor optical amplifier). Reference numeral 906 denotes a signal source. Reference numeral 902 denotes a feedback resistor. Reference numeral 905 denotes an inductor (inductance element). Reference numeral 903 denotes a negative power source. Reference numeral 904 denotes a positive power source. Reference numeral 907 denotes a resistor (resistor element). Reference numeral 908 denotes a diode (diode element).

The high-speed operation amplifier 900 is composed of an integrated circuit (IC). The high-speed operation amplifier 900 has an output current capacity not less than 300 mA and has a stable time (set ring time) of about 20 ns. The high-speed operation amplifier 900 constitutes a non-inverting amplifier. That is, the feedback resistor 902 is provided between an output terminal 910 of the high-speed operation amplifier 900 and an inverting input terminal 920. As an example, the resistance value of the feedback resistor 902 is 910Ω. The signal source 906 is provided between a non-inverting input terminal 930 of the high-speed operation amplifier 900 and ground.

The inductor 905 is provided between the output terminal 910 of the high-speed operation amplifier 900 and the semiconductor optical amplifier type gate switch 901. The inductor 905 provided at an output portion of the high-speed operation amplifier 900 is provided so as to prevent an overshooting of a current at an output rise-up time (ON time) of the high-speed operation amplifier 900. As an example, the inductance of the inductor 905 is 13 nH. The negative power source 903 is provided between a negative power source terminal 940 of the high-speed operation amplifier 900 and ground. As an example, the voltage of the negative power source 903 is −5 V. The positive power source 904 is provided between a positive power source terminal 950 of the high-speed operation amplifier 900 and ground. As an example, the voltage of the positive power source 904 is +5 V. A resistor 907 is provided between the inductor 905 and the semiconductor optical amplifier type gate switch 901 so as to prevent the ringing being generated. As an example, the resistance value of the resistor 907 is 110Ω in the example. The diode 908 is in parallel with the resistor 907 and is provided in the forward direction (forward bias) to the current flowing in the semiconductor optical amplifier type gate switch 901. As for the diode 908, a shottky diode having a low junction capacitance of about 10 pF is preferable. The shottky diode also has a forward voltage smaller than that of general diodes, so that the shottky diode contributes to provide low power consumption.

Operation and Properties of Driving Circuit:

When the semiconductor optical amplifier type gate switch 901 is set to ON, a driving current flows therein via the diode 908. Accordingly, the driving of the semiconductor optical amplifier type gate switch 901 can be performed only by setting the forward voltage of the diode 908 higher about from 0.4 to 0.6 V. When the semiconductor optical amplifier type gate switch 901 is set to OFF, a discharge current flows in the resistor 907 of 110Ω, so that the ringing can be prevented.

Figure 14:
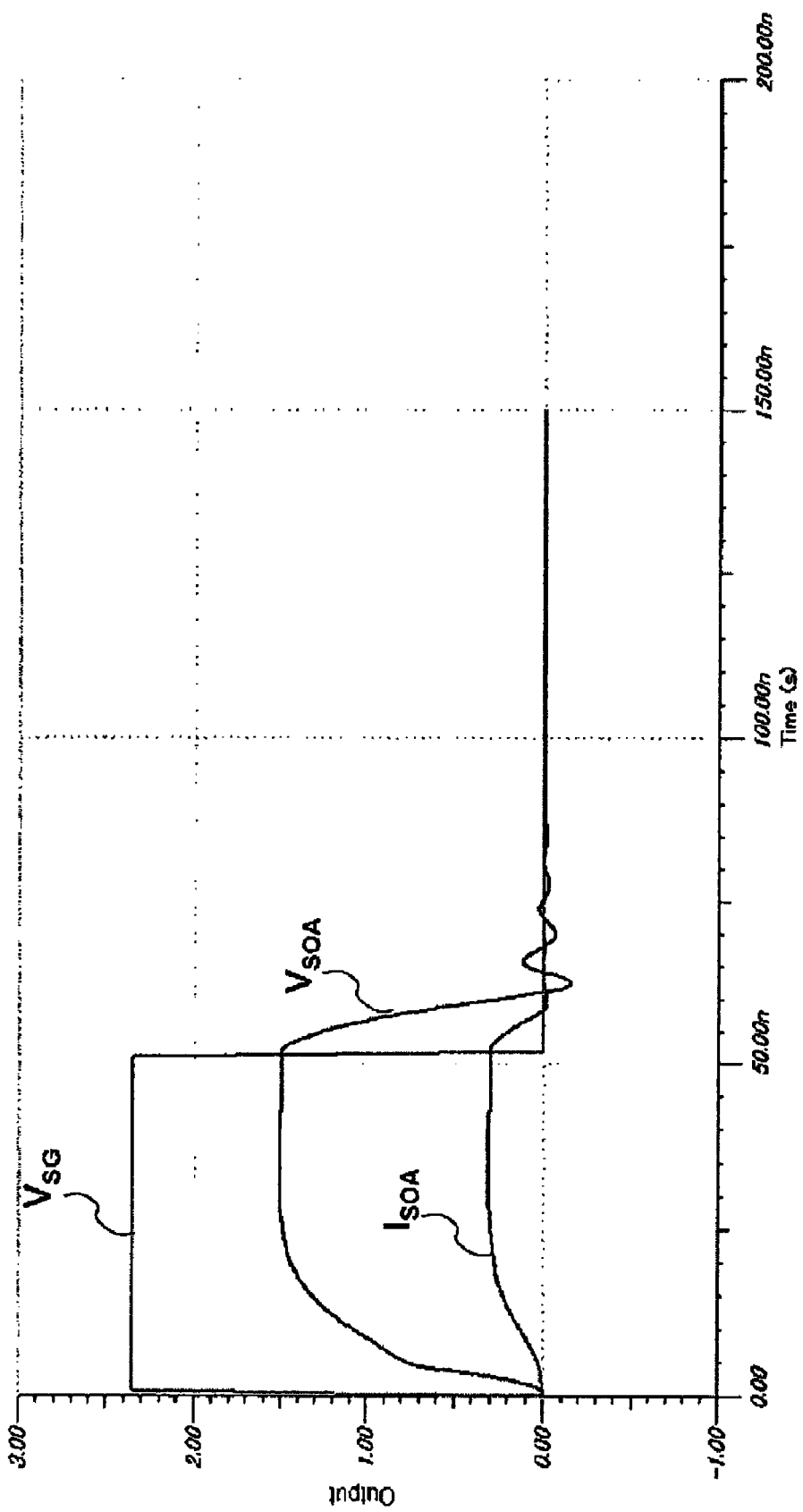
FIG. 14 is a waveform diagram of the semiconductor optical amplifier type gate switch in FIG. 13.

FIG. 14 shows a waveform of the driving circuit in FIG. 13. $V_{SG}$, $V_{SOA}$, and $I_{SOA}$ show the values of the same places in FIG. 10. When FIG. 14 is compared with FIG. 10, in order to apply 1.5 V to $V_{SOA}$, $V_{SG}$ needs 2.35 V, which is set higher by the forward voltage of the diode 908. However, the ringing of $V_{SOA}$ becomes not more than 0.65 V at the 70 ns, so that in the case of the construction of a matrix switch of 8×8, sufficient extinction ratio can be obtained according to the property in FIG. 8. $I_{SOA}$ falls down in synchronism with the falling down of $V_{SG}$, so that the ringing hardly occurs. The peak voltage 2.35 V of $V_{SG}$ in FIG. 14 is dramatically reduced as compared with the peak voltage 10.5 V thereof in FIG. 12. Consequently, the power consumption in the construction of the driving circuit in FIG. 13 is also reduced as compared with the power consumption in the construction of the driving circuit in FIG. 11.

Driving Circuit of Semiconductor Optical Amplifier Type Gate Switch: No. 4

Figure 15:
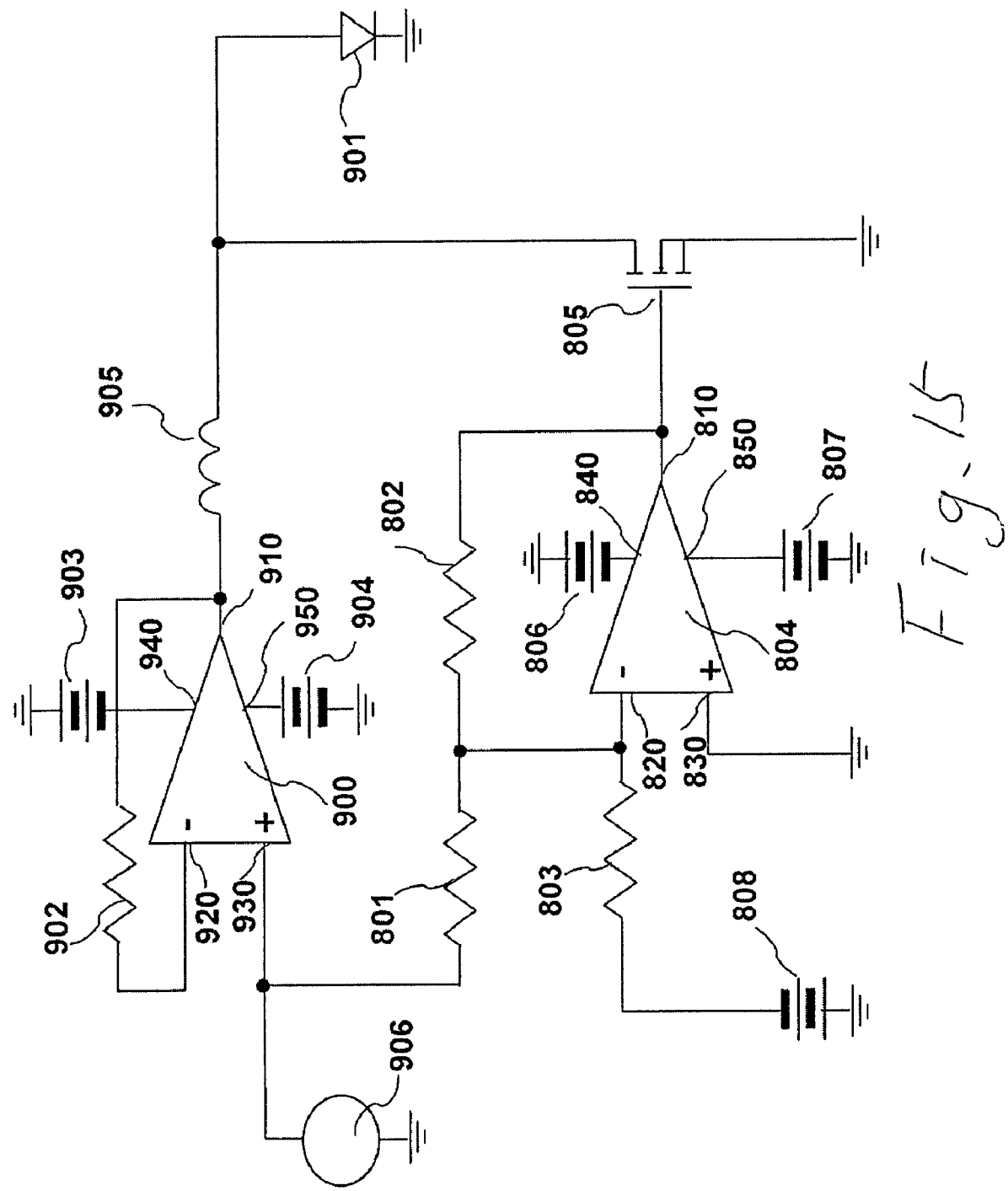
FIG. 15 is a diagram showing a driving circuit of the semiconductor optical amplifier type gate switch.

FIG. 15 shows a circuit diagram of a driving circuit of the semiconductor optical amplifier type gate switch. Reference numeral 900 denotes a high-speed operation amplifier IC. Reference numeral 901 denotes a semiconductor optical amplifier type gate switch (semiconductor optical amplifier). Reference numeral 906 denotes a signal source. Reference numeral 902 denotes a feedback resistor. Reference numeral 905 denotes an inductor (inductance element). Reference numeral 903 denotes a negative power source. Reference numeral 904 denotes a positive power source. Reference numerals 801, 802, and 803 each denote a resistor (resistor element). Reference numeral 804 denotes a high-speed operation amplifier. Reference numeral 805 denotes grounding means. Reference numeral 808 denotes a negative power source.

Structure of Driving Circuit:

The high-speed operation amplifier 900 is composed of an integrated circuit (IC). The high-speed operation amplifier 900 has an output current capacity not less than 300 mA and has a stable time (set ring time) of about 20 ns. The high-speed operation amplifier 900 constitutes a non-inverting amplifier. The feedback resistor 902 is provided between an output terminal 910 of the high-speed operation amplifier 900 and an inverting input terminal 920. As an example, the resistance value of the feedback resistor 902 is 910Ω. The signal source 906 is provided between a non-inverting input terminal 930 of the high-speed operation amplifier 900 and ground. The inductor 905 is provided between the output terminal 910 of the high-speed operation amplifier 900 and the semiconductor optical amplifier type gate switch 901. The inductor 905 provided at an output portion of the high-speed operation amplifier 900 is provided so as to prevent an overshooting of a current at an output rise-up time (ON time) of the high-speed operation amplifier 900. As an example, the inductance of the inductor 905 is 18 nH. The negative power source 903 is provided between a negative power source terminal 940 of the high-speed operation amplifier 900 and ground. As an example, the voltage of the negative power source 903 is −5 V. The positive power source 904 is provided between a positive power source terminal 950 of the high-speed operation amplifier 900 and ground. As an example, the voltage of the positive power source 904 is +5 V.

The high-speed operation amplifier 804 is the same integrated circuit (IC) as the high-speed operation amplifier 900. The operation amplifier 900 constitutes an inverting amplifier. Accordingly, the signal source 906 is connected to an inverting input terminal 820 of the high-speed operation amplifier 804 via the resistor 801. As an example, the resistance value of the resistor 801 is 455Ω. The feedback resistor 802 is provided between a portion between the resistor 801 and the inverting input terminal 820 and an output terminal of the high-speed operation amplifier 804. As an example, the resistance value of the feedback resistor 802 is 910Ω. The negative power source 808 is connected to the inverting input terminal 820 of the high-speed operation amplifier 804 via the resistor 803. The negative power source 808 is constituted by a voltage generator for offset adjustment. A non-inverting input terminal 830 of the high-speed operation amplifier 804 is connected to ground. A negative power supply terminal 840 of the high-speed operation amplifier 804 is connected to ground via a negative power supply 806. A positive power supply terminal 850 of the high-speed operation amplifier 804 is connected to ground via a positive power supply 807. As examples, the voltage of the negative power source 803 is −5 V, the voltage of the positive power source 807 is +5 V, and the resistance value of the resistor 803 is 910Ω.

The grounding means 805 is composed of an FET. The base of the FET is connected to the output terminal of the high-speed operation amplifier 804, the source of the FET is grounded, and the drain of the FET is connected to a portion between the inductor 905 and the semiconductor optical amplifier type gate switch 901.

Operation of Circuit:

When the semiconductor optical amplifier type gate switch 901 is set to ON, the output of the high-speed operation amplifier 804 becomes OFF. When the output of the high-speed operation amplifier 804 becomes OFF, the FET becomes OFF. When the FET becomes OFF, a current from the high-speed operation amplifier 900 is supplied only to the semiconductor optical amplifier type gate switch 901.

Figure 16:
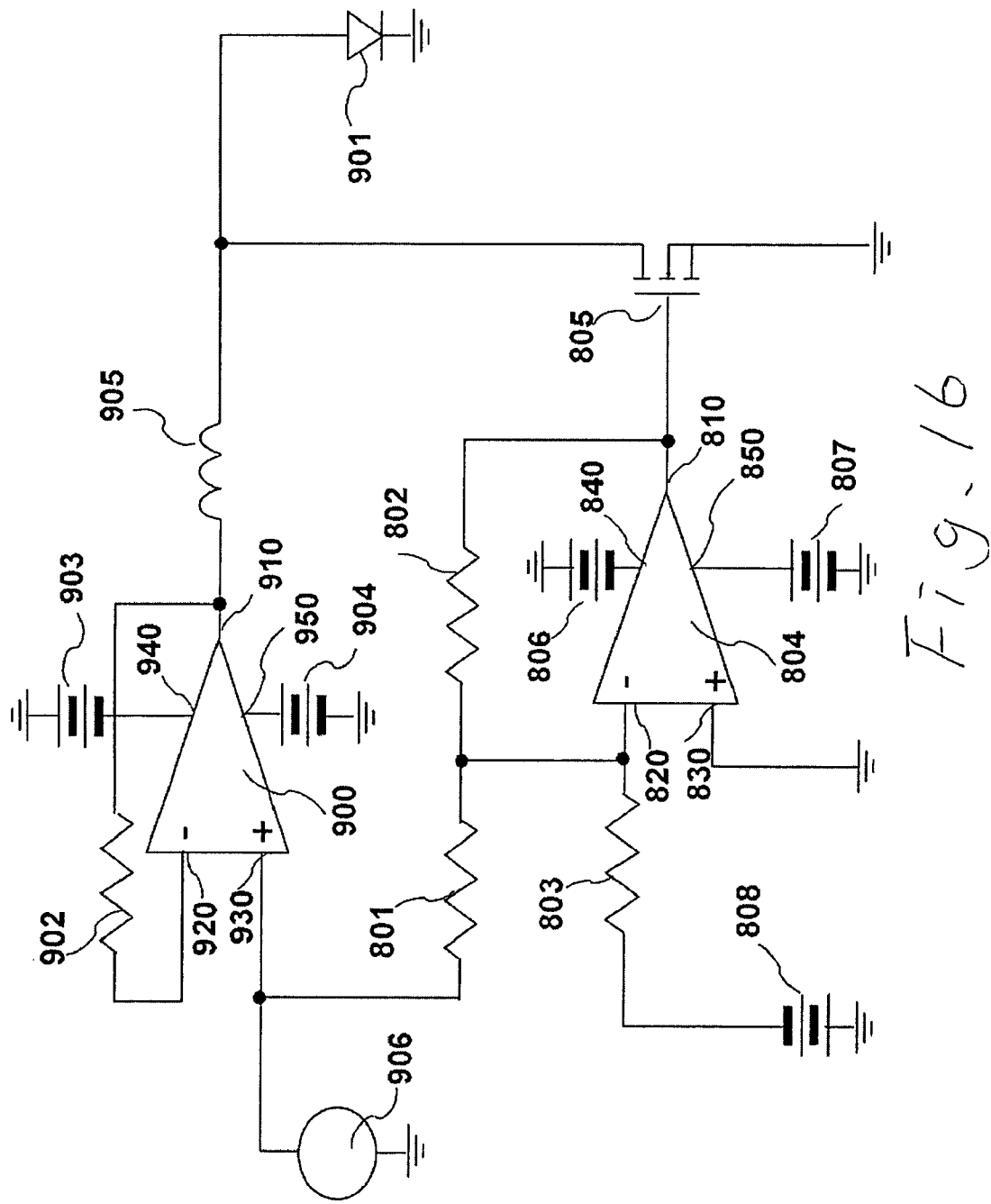
FIG. 16 is a waveform diagram of the semiconductor optical amplifier type gate switch in FIG. 15.

When the semiconductor optical amplifier type gate switch 901 is set to OFF state, the output of the high-speed operation amplifier 804 becomes ON. When the output of the high-speed operation amplifier 804 becomes ON, the FET becomes ON. When the FET becomes ON, the electric charge in the semiconductor optical amplifier type gate switch 901 is discharged to the ground via only the ON resistance of the FET, which allows a rapid discharge. Thereby, ringing can be prevented. FIG. 16 is a waveform diagram of the semiconductor optical amplifier type gate switch.

V1 shows a voltage of the output terminal of the high-speed operation amplifier 804. $V_{SG}$ shows an output voltage of the high-speed operation amplifier 900. $V_{SOA}$ shows a voltage applied to the semiconductor optical amplifier type gate switch 901. $I_{SOA}$ shows a current flowing in the semiconductor optical amplifier type gate switch 901. It is recognized that the waveforms of $V_{SOA}$ and $I_{SOA}$ fall down without generating ringing.

Second Embodiment

The embodiment is an invention in which the driving circuit of the first embodiment is applied to a capacitive load.

Driving Circuit of Capacitive Load: No. 1

Figure 17:
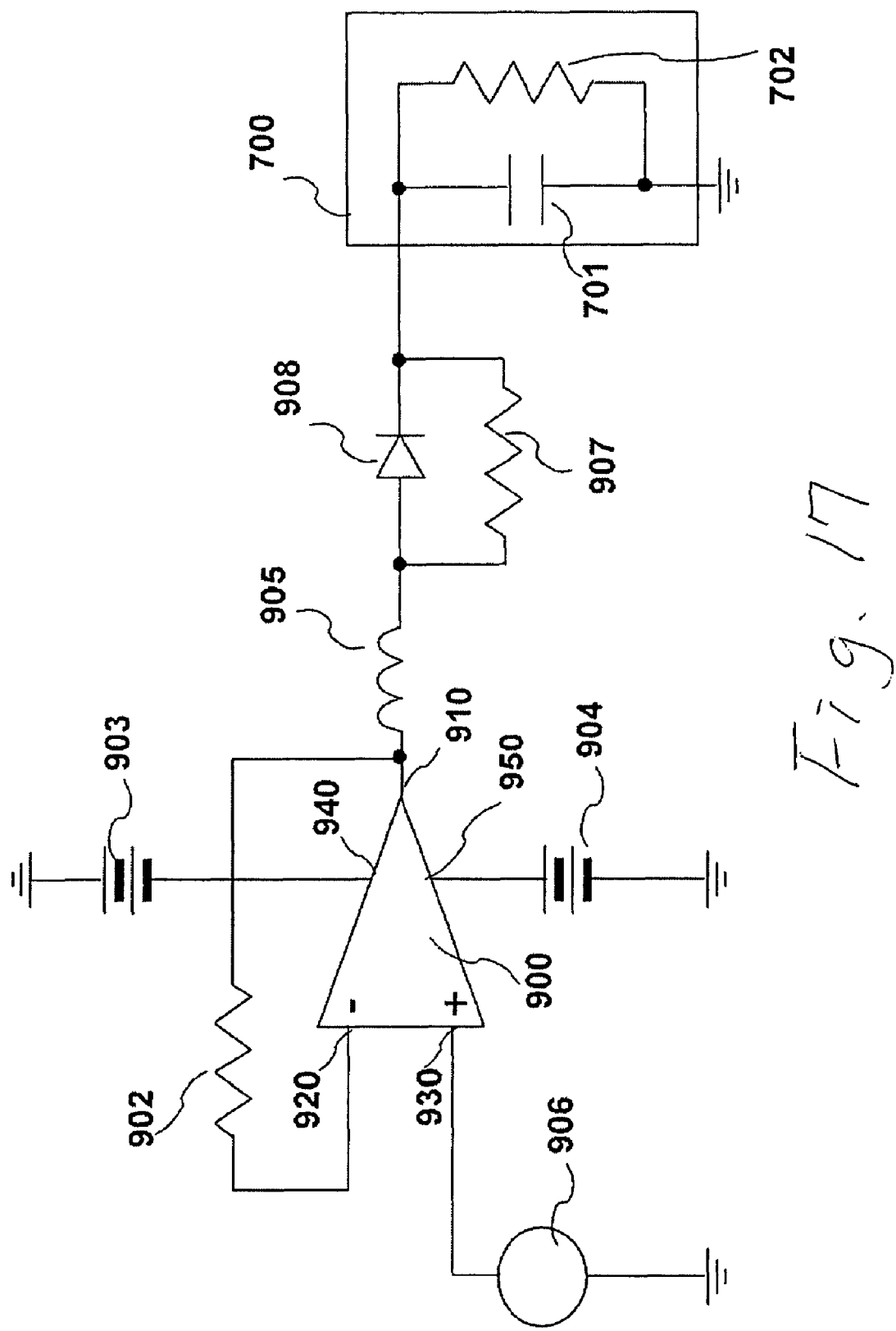
FIG. 17 is a circuit diagram of a driving circuit of a capacitive load.

FIG. 17 shows a circuit diagram of a driving circuit of a capacitive load. In FIG. 17, like reference numerals are used for like members in FIG. 13 and their descriptions will be omitted. Instead of the semiconductor optical amplifier type gate switch, FIG. 17 shows an example in which the driving circuit in FIG. 13 is applied to a capacitive load 700 having the same capacitance as in the semiconductor optical amplifier type gate switch. The capacitive load 700 is an element having at least a capacitive component 701. The capacitive load 700 may have a reactance component 702 in parallel with the capacitive component 701. A semiconductor lesser diode, an LED element, and the like are exemplified as the capacitive load 700.

Figure 18:
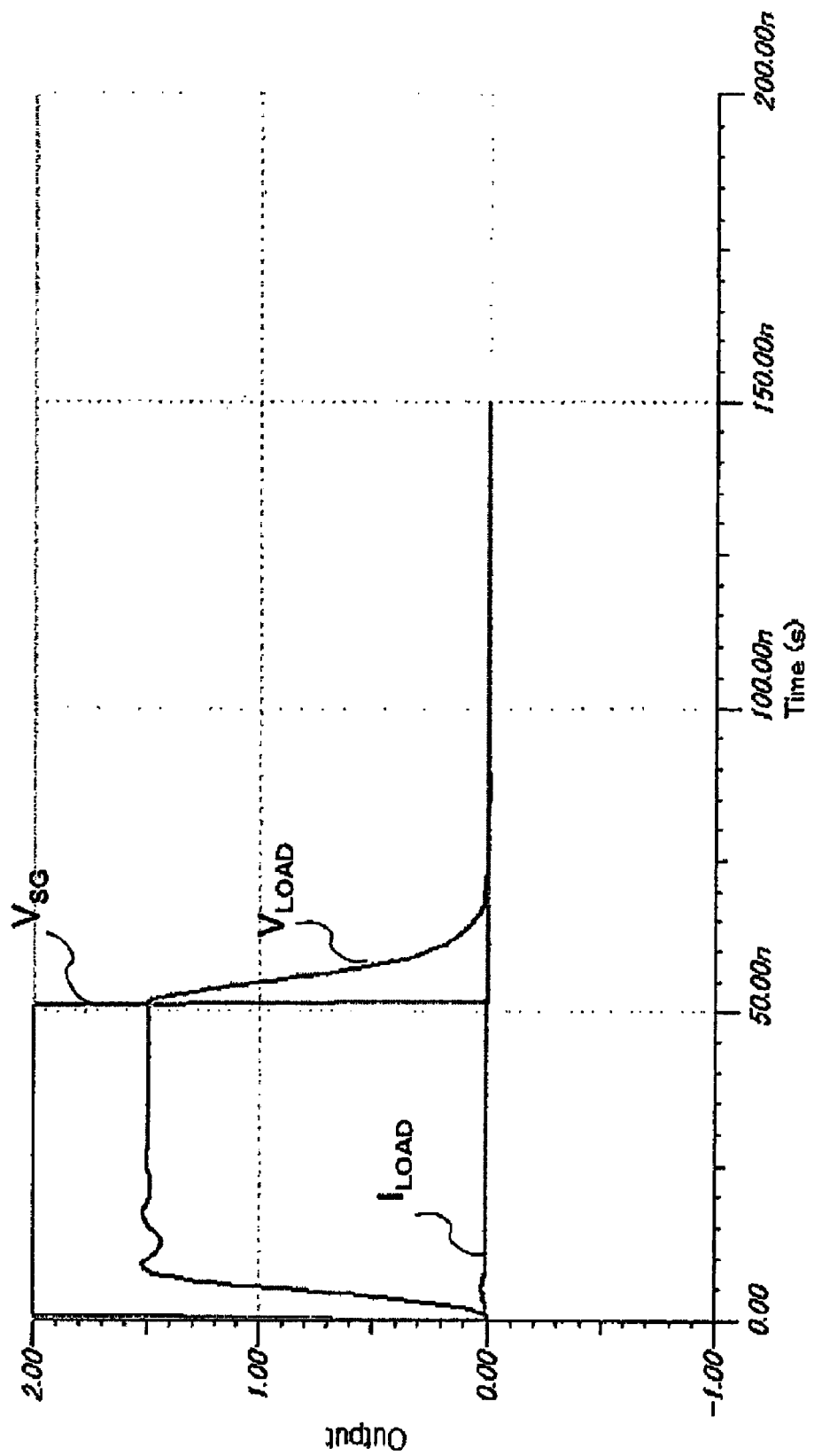
FIG. 18 is a waveform diagram of the capacitive load in FIG. 17.

FIG. 18 shows a waveform of the driving circuit in FIG. 17. $V_{SG}$ shows an output voltage of the high-speed operation amplifier 900, $V_{LOAD}$ shows a voltage applied to the capacitive load 700, and $I_{LOAD}$ shows a current applied to the capacitive load 700 in FIG. 18.

Driving Circuit of Capacitive Load: No. 2

Figure 19:
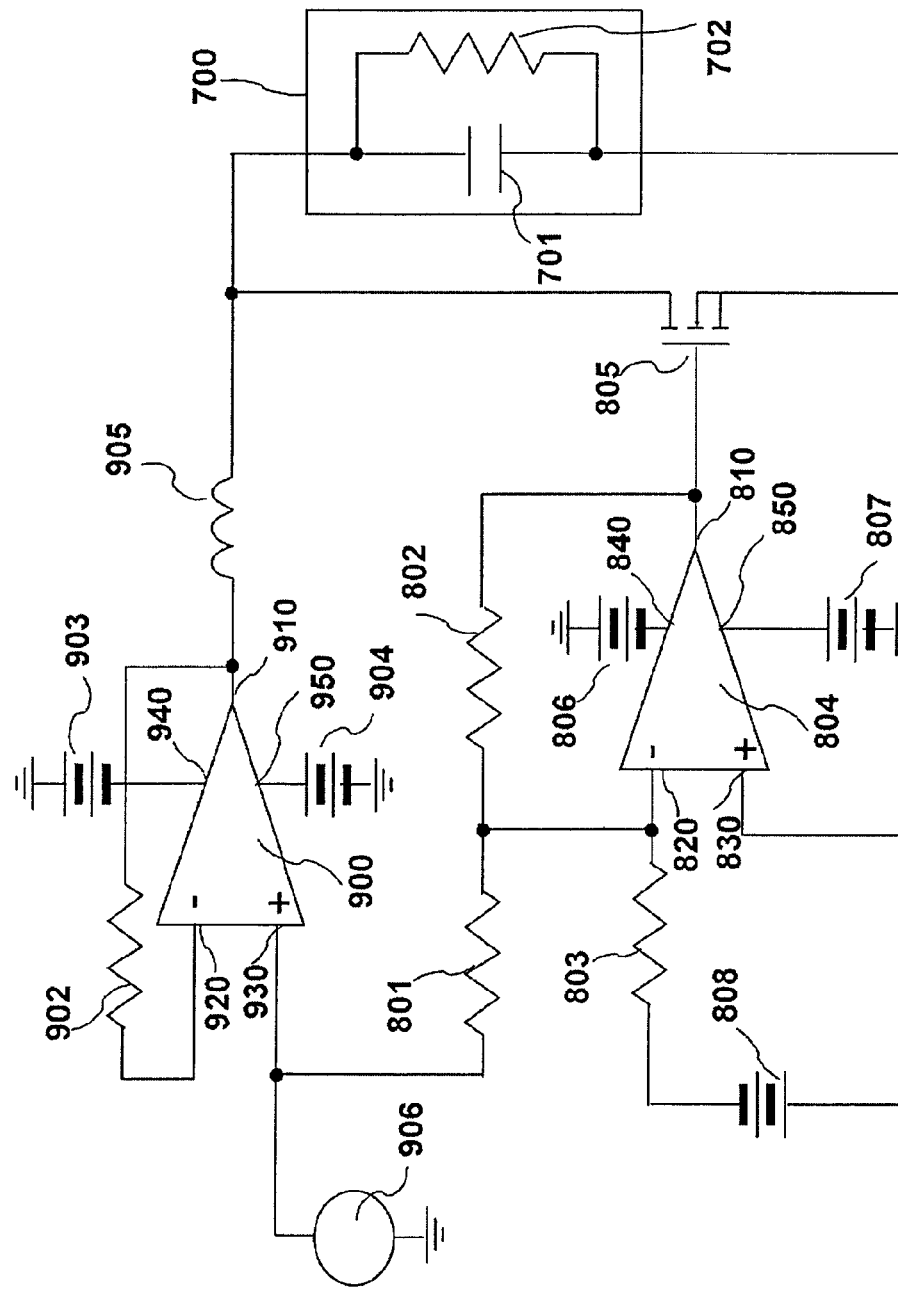
FIG. 19 is a circuit diagram of a driving circuit of the capacitive load.

FIG. 19 shows a circuit diagram of a driving circuit of the capacitive load.

In FIG. 19, like reference numerals are used for like members in FIG. 15 and their descriptions will be omitted. In FIG. 19, instead of the semiconductor optical amplifier type gate switch in FIG. 15, an example is shown in which the driving circuit in FIG. 13 is applied to a capacitive load 700 which is similar to the semiconductor optical amplifier type gate switch. The capacitive load 700 is an element having at least a capacitive component 701. The capacitive load 700 may have a reactance component 702 in parallel with the capacitive component 701. A semiconductor lesser diode, an LED element, and the like are exemplified as the capacitive load 700.

CONCLUSION

According to the first and second embodiments described above, linking which occurs at a falling down (OFF time) during driving of the semiconductor optical amplifier type gate switch or the capacitive load can be prevented. Therefore, electric power consumption (voltage) of the circuit which switches the semiconductor optical amplifier type gate switch or the capacitive load at high speed can be reduced.

The embodiments described above disclose the invention described below. The invention described below can be appropriately combined as needed.

What is claimed is:

1. An apparatus, comprising:
    an optical gate switch formed with a semiconductor optical amplifier having a junction capacitance charging electric charge;
    a current supply circuit to output a driving current in accordance with a driving signal for driving the optical gate switch, the driving current being output from an output terminal of the current supply circuit, to the optical gate switch, the driving current switching the optical gate switch in an ON state or in an OFF state;
    an inductor electrically coupled from the output terminal to the optical gate switch in series; and
    a parallel circuit comprising a diode connected in a forward bias direction of the current supply circuit, and a resistor connected in parallel with the diode, the parallel circuit being electrically coupled in series from the output terminal to the optical gate switch.

2. The apparatus according to claim 1, wherein the resistor has a resistance value large enough to reduce a ringing in the apparatus.

3. The apparatus according to claim 1, wherein the semiconductor optical amplifier switches light in accordance with the driving signal.

4. The apparatus according to claim 1, wherein the inductor substantially prevents an overshooting of the driving current from the current supply circuit, when the driving current from the current supply circuit rises.

5. The apparatus according to claim 1, wherein the driving current from the current supply circuit has a substantially rectangular shape.

6. An apparatus, comprising:
    an optical gate switch;
    a current supply circuit to output a driving current in accordance with a driving signal to drive the optical gate switch, the driving current being output from an output terminal and switching the optical gate switch to an ON state or an OFF state;
    an inductor electrically coupled from the output terminal to the optical gate switch in series; and
    a parallel circuit comprising a diode connected in a forward bias direction of the current supply circuit, and a resistor connected in parallel with the diode, the parallel circuit being electrically coupled in series from the output terminal to the optical gate switch.

7. The apparatus according to claim 6, wherein the resistor has a resistance value large enough to reduce a ringing in the apparatus.

* * * * *